(12) United States Patent
Fujiwara et al.

(10) Patent No.: US 8,212,622 B2
(45) Date of Patent: Jul. 3, 2012

(54) OSCILLATION CIRCUIT AND RECORDING APPARATUS

(75) Inventors: Tetsuya Fujiwara, Kanagawa (JP); Shingo Harada, Kanagawa (JP)

(73) Assignee: Sony Corporation, Tokyo (JP)

( * ) Notice: Subject to any disclaimer, the term of this patent is extended or adjusted under 35 U.S.C. 154(b) by 70 days.

(21) Appl. No.: 12/801,558

(22) Filed: Jun. 15, 2010

(65) Prior Publication Data

US 2011/0007615 A1    Jan. 13, 2011

(30) Foreign Application Priority Data

Jul. 8, 2009    (JP) ................................. 2009-161796

(51) Int. Cl.
*H03K 3/03*    (2006.01)
(52) U.S. Cl. ................................ 331/57; 331/46; 331/50

(58) Field of Classification Search .................... 331/57, 331/45, 46, 55, 56
See application file for complete search history.

(56) References Cited

U.S. PATENT DOCUMENTS

| 7,342,430 B1* | 3/2008 | Chiang ......................... 327/295 |
| 2003/0062960 A1* | 4/2003 | Bushman et al. ............... 331/45 |
| 2008/0068101 A1 | 3/2008 | Dosho et al. |

FOREIGN PATENT DOCUMENTS

| JP | 2000-156629 | 6/2000 |
| JP | 2008-529318 | 7/2008 |

* cited by examiner

*Primary Examiner* — Ryan Johnson
(74) *Attorney, Agent, or Firm* — Rader Fishman & Grauer, PLLC

(57) ABSTRACT

An oscillation circuit includes: n ring oscillators each formed from m delay elements connected annularly, m being an integer equal to or greater than 2, n being an integer equal to or greater than 2; and a phase coupled ring.

12 Claims, 12 Drawing Sheets

RELATED ART

RELATED ART

OSCILLATION CIRCUIT AND RECORDING APPARATUS

BACKGROUND OF THE INVENTION

1. Field of the Invention

This invention relates to an oscillation circuit of the multiphase coupled ring type and a recording apparatus wherein a multiphase clock is oscillated.

2. Description of the Related Art

Presently, a multiphase clock is used widely for timing regeneration, frequency/phase modulation and demodulation, delay measurement, write clock generation or write strategy on an optical disc represented by a DVD (Digital Versatile Disc) and a BD (Blu-ray Disk), and so forth.

For example, a write clock signal for an optical disk requires generation of a special write waveform and requires a phase resolution of such a high degree of accuracy of one several tenth the writing data rate.

Such a write clock as just described is generally implemented by selecting phases of a multistage ring oscillator OSC formed from a plurality of delay elements DLE connected in a ring form as seen in FIG. 1A by means of such a selection circuit MUX as shown in FIG. 1B and combining the selected phases.

Therefore, it is demanded for the multistage ring oscillator not only to have a high phase resolution but also to be accurate in regard to the phase order and position.

In recent years, the data rate for writing on an optical disk has become higher, and it becomes necessary for a multistage ring oscillator to have a phase resolution higher than an oscillation frequency.

In order to achieve such a high phase resolution as just mentioned, in the multistage ring oscillator described above with reference to FIG. 1A, it is necessary to suppress the delay time of the delay elements DLE per one stage to short time.

In other words, it is difficult to implement such a high phase resolution as described above from a point of view that very high current consumption is required.

Therefore, such a multistage coupled ring oscillation circuit as shown in FIG. 2A has been proposed in Japanese Patent Laid-Open No. 2000-156629 (hereinafter referred to as Patent Document 1), JP-T-2008-529318 (hereinafter referred to as Patent Document 2), J. G. Maneatis and M. A. Horowitz, "Precise delay generation using coupled oscillators," IEEE J. Solid-State Circuits, Vol. 28, No. 12, pp. 1273-1282, December 1993 (hereinafter referred to as Non-Patent Document 1) and A. Matsumoto, S. Sakiyama, Y. Tokunaga, T. Morie and S. Dosho, "A Design Method and Developments of a Low-Power and High-Resolution Multiphase Generation System," IEEE J. Solid-State Circuits, Vol. 43, No. 4, pp. 831-843, April 2008 (hereinafter referred to Non-Patent Document 2). A high-speed fine multistage clock can be implemented by the coupled ring oscillator.

FIGS. 2A to 2C show an example of a configuration of a multistage coupled ring oscillation circuit.

The multiphase coupled ring oscillation circuit 10 shown in FIG. 2A has a configuration for nine phases.

The multiphase coupled ring oscillation circuit 10 is configured such that a plurality of (three) small-number-stage (three-stage) inverter ring oscillation circuits 11 to 13 shown in FIG. 2B are coupled by a single multistage (nine-stage) inverter ring circuit 14 shown in FIG. 2C.

In other words, each two small-number-stage rings are coupled by a single phase coupled element (path) and such three rings are coupled into a ring.

In the following description, each of the inverter ring oscillation circuits 11 to 13 shown in FIG. 2B is referred to as main ring, and the inverter ring oscillation circuit 14 shown in FIG. 2C is referred to as phase coupled ring.

In FIG. 2A, a phase coupled element of the phase coupled ring 14 is indicated by an inverter INV.

However, as disclosed in Patent Document 1, Patent Document 2 and Non-Patent Document 2 mentioned hereinabove, the phase coupled element may not be an inverter but may be any element which can determine the phase between main rings such as, for example, a resistor.

In particular, the phase coupled ring itself needs not oscillate but is driven by the plural main rings to oscillate.

In other words, the oscillation frequency is determined by the small-number-stage main rings 11 to 13, and the phase between the main rings is determined by the phase coupled ring 14.

In short, a high-speed and fine multiphase clock which is difficult to implement using an ordinary multistage ring oscillation circuit or a like circuit can be implemented by the multistage coupled ring oscillation circuit.

SUMMARY OF THE INVENTION

However, such a configuration wherein the phase coupled ring is formed as a single path as shown in FIG. 2A according to the related art apparatus described above has a problem that the phase rotation amount per one stage of a phase coupled element differs in an initial state or due to a variation of the capacity of the phase coupled elements or the like, resulting in presence of a plurality of oscillation states.

Therefore, if this problem occurs, the order of the phases outputted from each node of the oscillator changes.

In particular, if the write strategy system for an optical disk shown in FIG. 1B is taken as an example, then although an oscillator output is selected to generate a write clock, if the phase order changes, then a desired write clock cannot be generated, and this gives rise to a write error.

Since the proposed coupled type ring oscillation circuit has a plurality of oscillation states in this manner, where it is used for an application circuit or system, it makes a cause of a malfunction. Further, the proposed coupled ring oscillation circuit exhibits a tradeoff in design as hereinafter described, and this tradeoff restricts the flexibility of design.

Therefore, it is considered that a technique or configuration for converging the oscillation state into a single desired oscillation state with certainty eliminating the problem described above is essentially required.

However, Non-Patent Document 1, Patent Document 1 and Patent Document 2 mentioned hereinabove do not clearly indicate such a method or configuration which prevents a plurality of oscillation states as described above.

Meanwhile, although Non-Patent Document 2 describes a method of compulsorily applying a voltage to an oscillation node so that a desired oscillation state may be obtained, it is silent of details of the method.

Further, it is considered that also this method requires an additional circuit and, depending upon a manner of control of the additional circuit, an oscillation state different from a desired oscillation state may be established and a plurality of oscillation states may not be suppressed.

Therefore, it is desirable to provide an oscillation circuit of the multiphase coupled ring type and a recording apparatus wherein the oscillation state can be converged into a single desired oscillation condition state.

According to an embodiment of the present invention, there is provided an oscillation circuit including n ring oscillators each formed from m delay elements connected annularly, m being an integer equal to or greater than 2, n being an integer equal to or greater than 2, and a phase coupled ring formed from k different types of phase coupled elements provided between an output of the delay element of the jth stage in the ring oscillator of the ith stage and an output of the delay element of the (j+b)th stage, but of the (j+b−m)th stage where (j+b)>m, of the ring oscillator of the (i+a)th stage or, where (i+a)>n, an output of the delay element of the (j+b+1)th stage, but of the (j+b+1−m)th stage where (j+b+1)>m, of the ring oscillator of the (i+a−n)th stage, i being an integer which satisfies 1≦i≦n, j being an integer which satisfies 1≦j≦m, a being an integer which is a residue when k is divided by n, k being an integer which satisfies 1≦k≦(m·n/2), b being an integer which is a quotient when k is divided by n.

According to another embodiment of the present invention, there is provided a recording apparatus including: a recording medium; an optical recording section configured to write information into or on the recording medium in response to a multiphase write clock; and a write strategy section configured to supply the multiphase write clock to the optical recording section. The write strategy section includes an oscillation circuit for oscillating the multiphase write clock and a multiplexer for selecting a write clock of a phase from within an output of the oscillation circuit and supplying the selected write clock to the optical recording section. The oscillation circuit includes n ring oscillators each formed from m delay elements connected annularly, m being an integer equal to or greater than 2, n being an integer equal to or greater than 2, and a phase coupled ring formed from k different types of phase coupled elements provided between an output of the delay element of the jth stage in the ring oscillator of the ith stage and an output of the delay element of the (j+b)th stage, but of the (j+b−m)th stage where (j+b)>m, of the ring oscillator of the (i+a)th stage or, where (i+a)>n, an output of the delay element of the (j+b+1)th stage, but of the (j+b+1−m)th stage where (j+b+1)>m, of the ring oscillator of the (i+a−n)th stage, i being an integer which satisfies 1≦i≦n, j being an integer which satisfies 1≦j≦m, a being an integer which is a residue when k is divided by n, k being an integer which satisfies 1≦k≦(m·n/2), b being an integer which is a quotient when k is divided by n.

According to a further embodiment of the present invention, there is provided a recording apparatus including: a recording medium; an optical recording section configured to write information into or on the recording medium in response to a multiphase write clock; and a write strategy section configured to supply the multiphase write clock to the optical recording section. The write strategy section includes an oscillation circuit for oscillating the multiphase write clock and a multiplexer for selecting a write clock of a phase from within an output of the oscillation circuit and supplying the selected write clock to the optical recording section. The oscillation circuit includes a plurality of ring oscillators each formed from a plurality of delay elements connected annularly, and a phase coupled ring formed from a plurality of first phase coupled elements connected annularly. Each of the ring oscillators includes a plurality of first connecting nodes between the delay elements. The phase coupled ring includes a plurality of second connecting nodes between the phase coupled elements. The first connecting nodes of the ring oscillators are individually connected to the second connecting nodes different from each other of the phase coupled ring. Arbitrary ones of the second connecting nodes of the phase coupled ring are connected by a second phase coupled element disposed at least on a second path different from a first path on which the first phase coupled elements are disposed.

With the oscillation circuit, it is possible to converge the oscillation state to a single desired oscillation state.

The above and other features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

In the following, preferred embodiments of the present invention are described with reference to the accompanying drawings.

It is to be noted that the description is given in the following order:
1. First Embodiment (first example of a configuration of an oscillation circuit)
2. Second Embodiment (second example of a configuration of an oscillation circuit)
3. Third Embodiment (example of a configuration of an optical disk apparatus)

1. First Embodiment

Figure 1A:
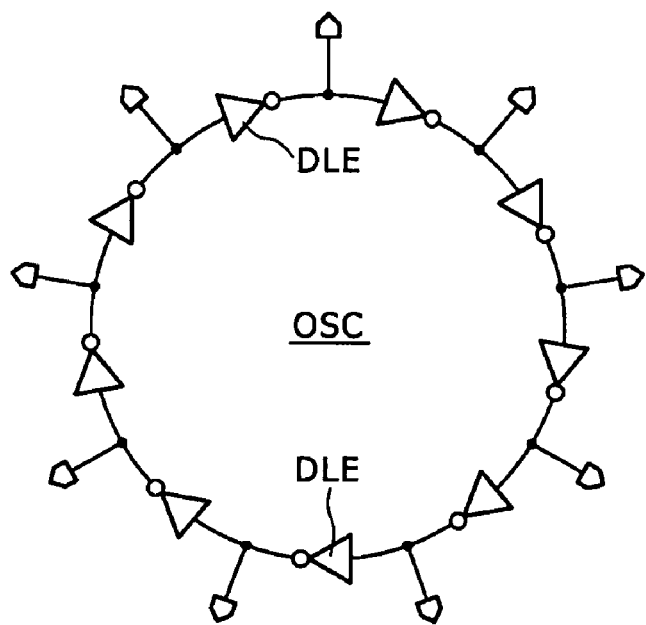
FIGS. 1A and 1B are diagrammatic views showing a configuration and an application of a multistage ring oscillator, respectively.
Figure 1B:
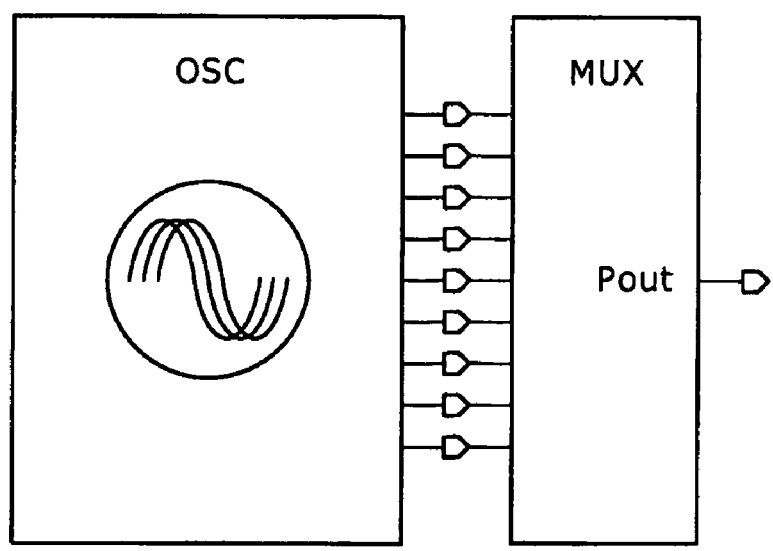
Figure 2A:
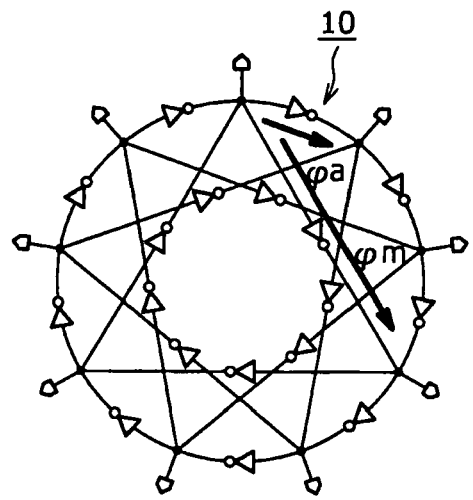
FIGS. 2A, 2B and 2C are diagrammatic views showing an example of a configuration of a multistage coupled ring oscillator.
Figure 2B:
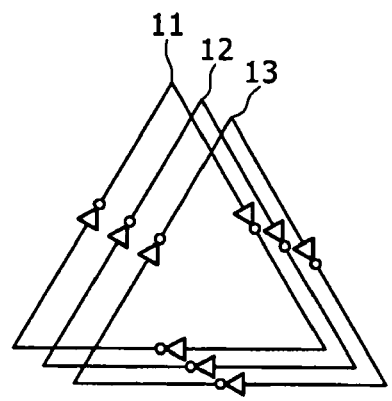
Figure 2C:
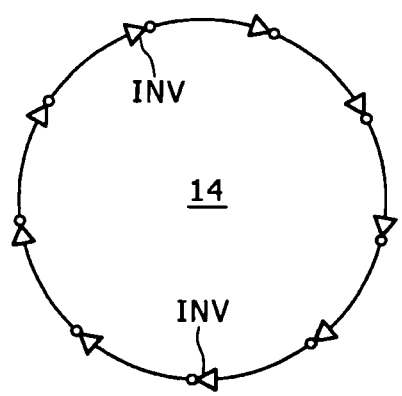
Figure 3:
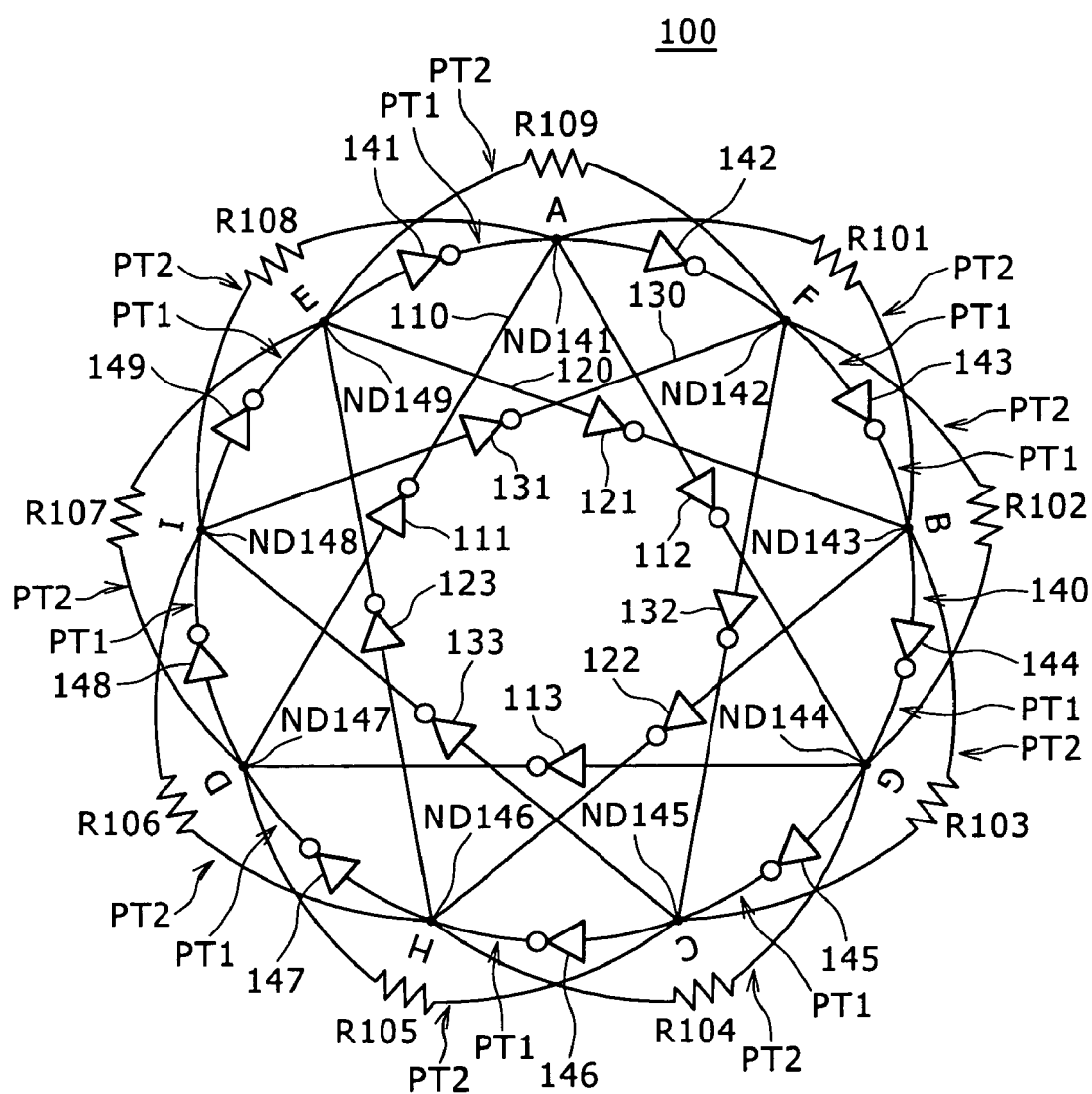
FIG. 3 is a diagrammatic view showing an example of a nine-phase configuration of a multiphase coupled ring type oscillation circuit according to a first embodiment of the present invention.
Figure 4A:
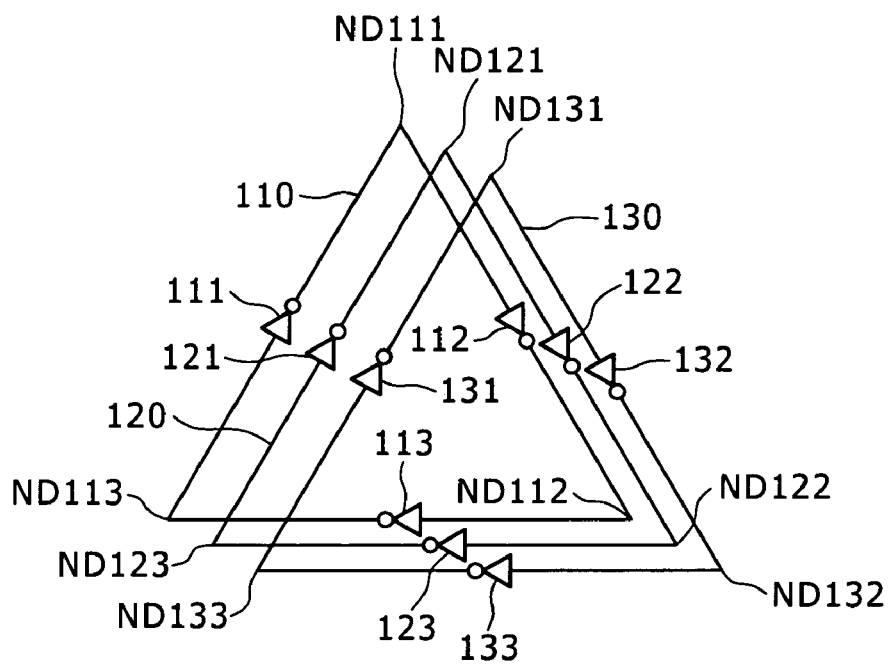
FIGS. 4A and 4B are diagrammatic views separately showing principal components of the multiphase coupled ring type oscillation circuit of FIG. 3.
Figure 4B:
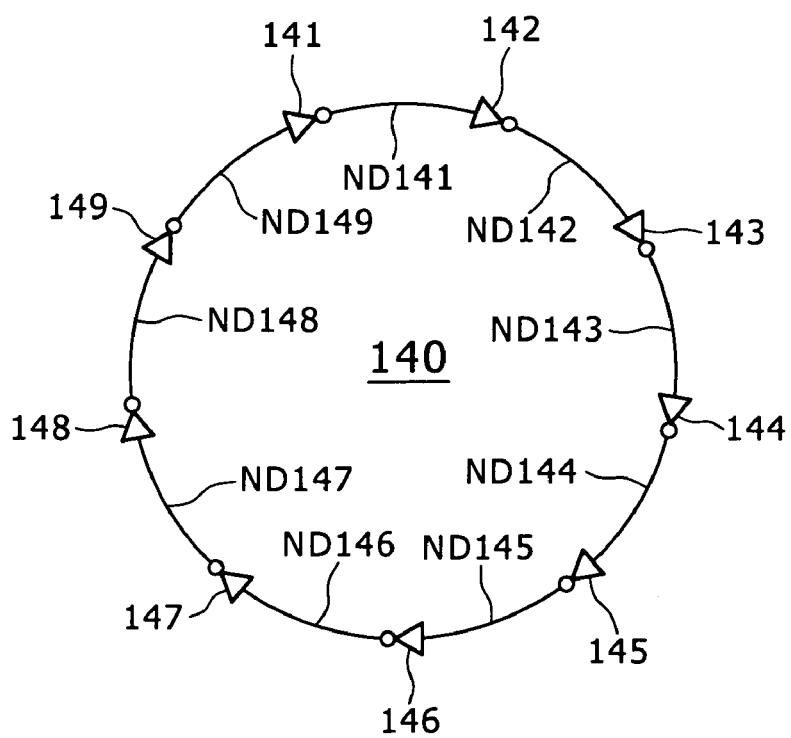

FIG. 3 shows a configuration of a multiphase coupled ring type oscillation circuit according to a first embodiment of the present invention, and FIGS. 4A and 4B show principal components of the multiphase coupled ring type oscillation circuit of FIG. 3.

Referring to FIGS. 3, 4A and 4B, the multiphase coupled ring type oscillation circuit 100 shown includes a plurality of or n ring oscillators main rings 110, 120 and 130 each of which forms a small-number-stage or m-stage ring oscillation circuit, and a phase coupled ring 140 which forms a multi-stage ring oscillation circuit. Here, m and n are integers equal to or greater than 2. In the multiphase coupled ring type oscillation circuit 100 shown, m is 3 and n is 3.

Referring particularly to FIGS. 3 and 4A, the main ring 110 includes inverters 111, 112 and 113 as m delay elements connected in an annular ring.

The inverter 111 is connected at an output terminal thereof to an input terminal of the inverter 112, and the connecting node between them is a node ND111.

The inverter 112 is connected at an output terminal thereof to an input terminal of the inverter 113, and the connecting node between them is a node ND112.

The inverter 113 is connected at an output terminal thereof to an input terminal of the inverter 111, and the connecting node between them is a node ND113.

The main ring 110 is connected to the phase coupled ring 140 such that it forms, for example, an equilateral triangle having vertices at the three nodes ND111, ND112 and ND113 as first nodes.

The main ring 120 includes inverters 121, 122 and 123 as m delay elements connected in an annular ring.

The inverter 121 is connected at an output terminal thereof to an input terminal of the inverter 122, and the connecting node between them is a node ND121.

The inverter 122 is connected at an output terminal thereof to an input terminal of the inverter 123, and the connecting node between them is a node ND122.

The inverter 123 is connected at an output terminal thereof to an input terminal of the inverter 121, and the connecting node between them is a node ND123.

The main ring 120 is connected to the phase coupled ring 140 such that it forms, for example, an equilateral triangle having vertices at the three nodes ND121, ND122 and ND123 as first nodes.

The main ring 130 includes inverters 131, 132 and 133 as m delay elements connected in an annular ring.

The inverter 131 is connected at an output terminal thereof to an input terminal of the inverter 132, and the connecting node between them is a node ND131.

The inverter 132 is connected at an output terminal thereof to an input terminal of the inverter 133, and the connecting node between them is a node ND132.

The inverter 133 is connected at an output terminal thereof to an input terminal of the inverter 131, and the connecting node between them is a node ND133.

The main ring 130 is connected to the phase coupled ring 140 such that it forms, for example, an equilateral triangle having vertices at the three nodes ND131, ND132 and ND133 as first nodes.

The phase coupled ring 140 includes a plurality of phase coupled elements, in the present embodiment, nine inverters 141 to 149, nine nodes ND141 to ND149 and nine resistors R101 to R109 as phase coupled elements connected at every two stages of inverters and having no inversion function.

The inverters 141 to 149 correspond to first phase coupled elements, and the resistors R101 to R109 correspond to the second phase coupled elements. Further, the nodes ND141 to ND149 correspond to the second nodes.

An output terminal of the inverter 141 and an input terminal of the inverter 142 are connected to each other, and the connecting node between them is the node ND141.

An output terminal of the inverter 142 and an input terminal of the inverter 143 are connected to each other, and the connecting node between them is the node ND142.

An output terminal of the inverter 143 and an input terminal of the inverter 144 are connected to each other, and the connecting node between them is the node ND143.

An output terminal of the inverter 144 and an input terminal of the inverter 145 are connected to each other, and the connecting node between them is the node ND144.

An output terminal of the inverter 145 and an input terminal of the inverter 146 are connected to each other, and the connecting node between them is the node ND145.

An output terminal of the inverter 146 and an input terminal of the inverter 147 are connected to each other, and the connecting node between them is the node ND146.

An output terminal of the inverter 147 and an input terminal of the inverter 148 are connected to each other, and the connecting node between them is the node ND147.

An output terminal of the inverter 148 and an input terminal of the inverter 149 are connected to each other, and the connecting node between them is the node ND148.

An output terminal of the inverter 149 and an input terminal of the inverter 141 are connected to each other, and the connecting node between them is the node ND149.

The nodes ND141 and ND143 are connected to each other through the resistor R101.

In particular, in the present embodiment, the nodes ND141 and ND143 are connected to each other by a second path PT2, which has the resistor R101, different from a connection path of the two inverters 142 and 143 connected in series, that is, different from a first path PT1.

The nodes ND142 and ND144 are connected to each other through the resistor R102.

In particular, in the present embodiment, the nodes ND142 and ND144 are connected to each other by another second path PT2, which has the resistor R102, different from a connection path of the two inverters 143 and 144 connected in series, that is, different from another first path PT1.

The nodes ND143 and ND145 are connected to each other through the resistor R103.

In particular, in the present embodiment, the nodes ND143 and ND145 are connected to each other by a further second path PT2, which has the resistor R103, different from a connection path of the two inverters 144 and 145 connected in series, that is, different from a further first path PT1.

The nodes ND144 and ND146 are connected to each other through the resistor R104.

In particular, in the present embodiment, the nodes ND144 and ND146 are connected to each other by a still further second path PT2, which has the resistor R104, different from a connection path of the two inverters 145 and 146 connected in series, that is, different from a still further first path PT1.

The nodes ND145 and ND147 are connected to each other through the resistor R105.

In particular, in the present embodiment, the nodes ND145 and ND147 are connected to each other by a yet further second path PT2, which has the resistor R105, different from a connection path of the two inverters 146 and 147 connected in series, that is, different from a yet further first path PT1.

The nodes ND146 and ND148 are connected to each other through the resistor R106.

In particular, in the present embodiment, the nodes ND146 and ND148 are connected to each other by a yet further second path PT2, which has the resistor R106, different from a connection path of the two inverters 147 and 148 connected in series, that is, different from a yet further first path PT1.

The nodes ND147 and ND149 are connected to each other through the resistor R107.

In particular, in the present embodiment, the nodes ND147 and ND149 are connected to each other by a yet further second path PT2, which has the resistor R107, different from a connection path of the two inverters 148 and 149 connected in series, that is, different from a yet further first path PT1.

The nodes ND148 and the ND141 are connected to each other through the resistor R108.

In particular, in the present embodiment, the nodes ND148 and ND141 are connected to each other by a yet further second path PT2, which has the resistor R108, different from a connection path of the two inverters 149 and 141 connected in series, that is, different from a yet further first path PT1.

The nodes ND149 and ND142 are connected to each other through the resistor R109.

In particular, in the present embodiment, the nodes ND149 and ND142 are connected to each other by a yet further second path PT2, which has the resistor R109, different from a connection path of the two inverters 141 and 142 connected in series, that is, different from a yet further first path PT1.

The nodes ND111 to ND113, ND121 to ND123 and ND131 to ND133 of the main rings 110, 120 and 130 are connected to the nodes ND141 to ND149 of the phase coupled ring 140, respectively.

The node ND111 of the main ring 110 is connected to the node ND141, and the connecting node between them is a node A.

The node ND121 of the main ring 120 is connected to the node ND142, and the connecting node between them is a node F.

The node ND131 of the main ring 130 is connected to the node ND143, and the connecting node between them is a node B.

The node ND112 of the main ring 110 is connected to the node ND144, and the connecting node between them is a node G.

The node ND122 of the main ring 120 is connected to the node ND145, and the connecting node between them is a node C.

The node ND132 of the main ring 130 is connected to the node ND146, and the connecting node between them is a node H.

The node ND113 of the main ring 110 is connected to the node ND147, and the connecting node between them is a node D.

The node ND123 of the main ring 120 is connected to the node ND148, and the connecting node between them is a node I.

The node ND133 of the main ring 130 is connected to the node ND149, and the connecting node between them is a node E.

In this manner, the multiphase coupled ring type oscillation circuit 100 of the present first embodiment is formed from a nine-phase phase coupled ring type oscillation circuit.

Usually, the nine-phase phase coupled ring type oscillation circuit exhibits three oscillation stages of $\Phi a=80°$, $200°$ and $320°$ as hereinafter described.

The multiphase coupled ring type oscillation circuit 100 of the present first embodiment is shown as an example of a configuration for oscillating in a single oscillation state wherein $\Phi a=200°$ by connecting the resistors R101 to R109 across every two inverters on the phase coupled ring 140.

In the following, the reason why the multiphase coupled ring type oscillation circuit 100 of the present first embodiment oscillates in the single oscillation state wherein $\Phi a=200°$ is described.

Figure 5:
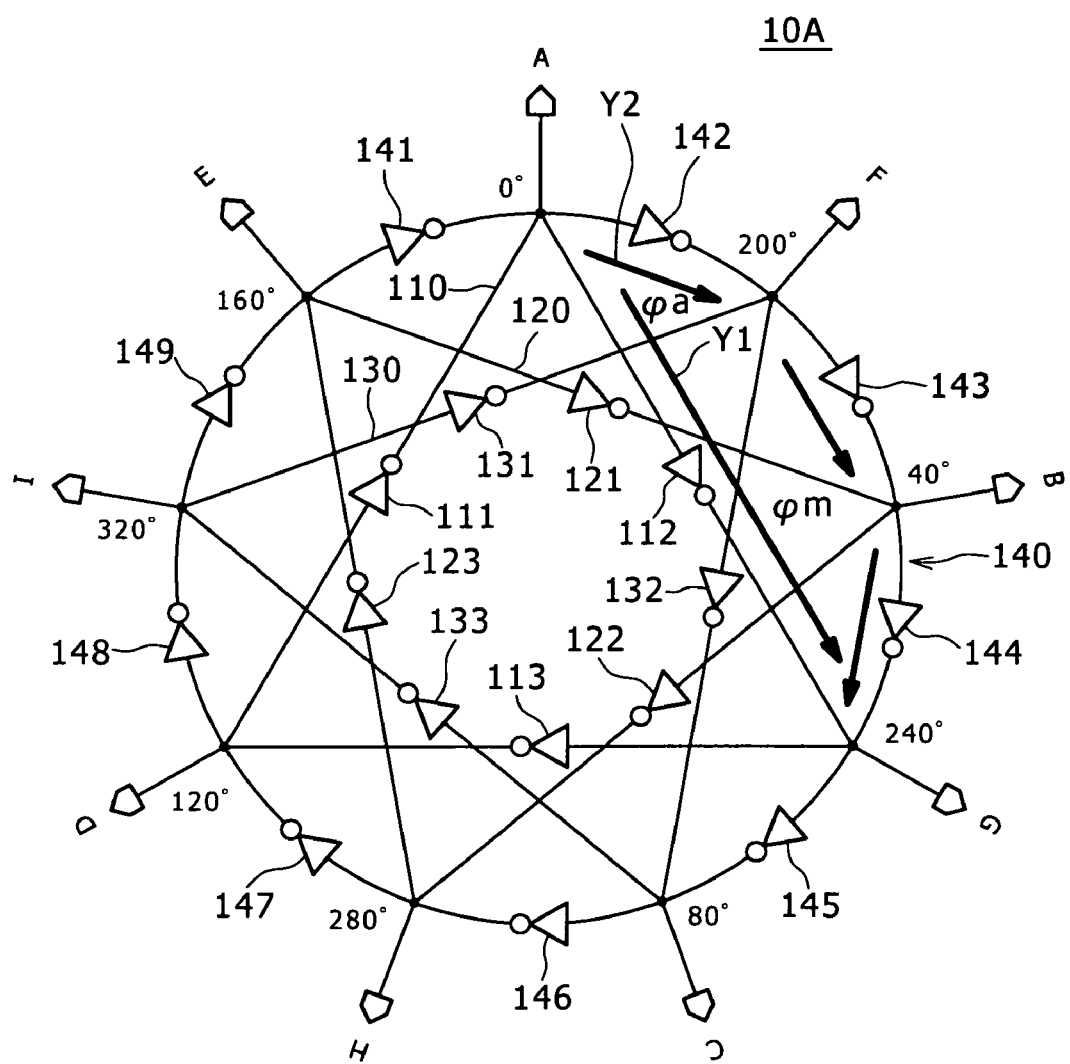
FIG. 5 is a diagrammatic view showing a configuration of an ordinary nine-phase phase coupled ring type oscillation circuit.

Before the reason why the multiphase coupled ring type oscillation circuit 100 oscillates in the single oscillation state wherein $\Phi a=200°$ is described, it is described that an ordinary nine-phase phase coupled ring type oscillation circuit 10A shown in FIG. 5 has three oscillation states wherein $\Phi a=80°$, $200°$ and $320°$.

It is to be noted that, in order to facilitate understandings, similar reference characters to those of FIGS. 3, 4A and 4B are used in FIG. 5.

Referring to FIG. 5, three main rings 110, 120 and 130 shown are oscillating.

Here, for example, if the main ring 110 is taken as an example, then when a signal propagates as indicated by an arrow mark Y1 in FIG. 5, since an inverter is an inverting element for the phase, the phase rotation amount $\Phi m$ by one inverter can be represented by the following expression:

$$\Phi m = 180° \cdot (1+1/M) \qquad \text{(expression 1)}$$

where M is the inverter stage number of the main ring, and the term $1/M$ represents a phase delay by a parasitic element upon mounting and so forth.

Where the inverter stage number of the main ring shown in FIG. 5 is three, that is, where M=3, the phase rotation amount $\Phi m$ is $\Phi m=240°$ from the expression 1.

Then, the phase rotation amount $\Phi a$ by an inverter of one stage, which is a phase coupled element, indicated by an arrow mark Y2 in the phase coupled ring 140 shown in FIG. 5 can be represented by the following expression:

$$\Phi a = 180 \cdot \{1 \pm L/(M \cdot N)\} \qquad \text{(expression 2)}$$

where N is the number of main rings, and L is an integer equal to or greater than 0 but smaller than (M·N). The reason why the sign of the term of L/(M·N) is ± is that, since the phase coupled ring 140 itself needs not oscillate but is driven by the main rings, it indicates that the inverters which are phase coupled elements can continue oscillation even where $\Phi a<180°$.

Further, oscillation of the nine-phase phase coupled ring type oscillation circuit 10A of FIG. 5 continues when the phase rotation amount $\Phi m$ and the phase rotation amount $\Phi a$ satisfy the following relationship:

$$\Phi m = (N \cdot \Phi a) \bmod 360° \qquad \text{(expression 3)}$$

where mod is the modulo, and the left side of the expression 3 represents the residue when $N \cdot \Phi a$ is divided by $360°$.

Further, from the expression 3 above, the phase relationship between the main rings varies depending upon the phase of the phase rotation amount $\Phi a$. In other words, it is indicated that a plurality of oscillation states exist.

Further, from the expressions 1 to 3, the nine-phase phase coupled ring type oscillation circuit 10A can have N oscillation states, that is, a number of oscillation states equal to the number of main rings connected in parallel can exist.

Therefore, in the case of the phase coupled ring type oscillation circuit 10A of FIG. 5 which involves nine phases (M=3 and N=3), three oscillation states exist.

Further, from the expressions 2 and 3, the phase rotation amount $\Phi a$ which satisfies the conditions is $80°$ (L=−5), $200°$ (L=1) and $320°$ (L=7).

Figure 6A:
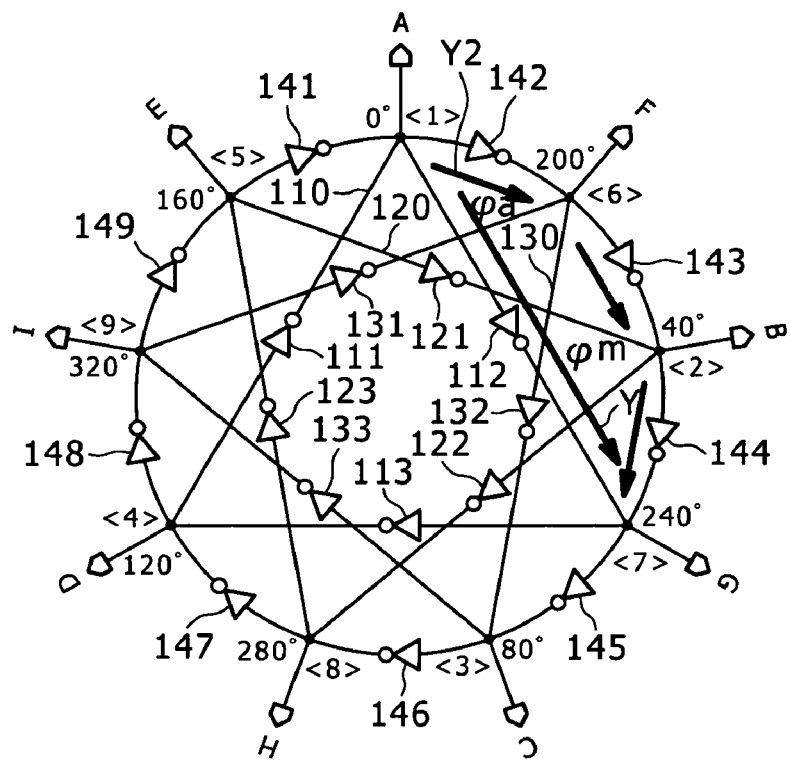
FIGS. 6A and 6B are diagrammatic views illustrating phase transition of $\Phi a=200°$ in the nine-phase phase coupled ring type oscillation circuit.
Figure 6B:
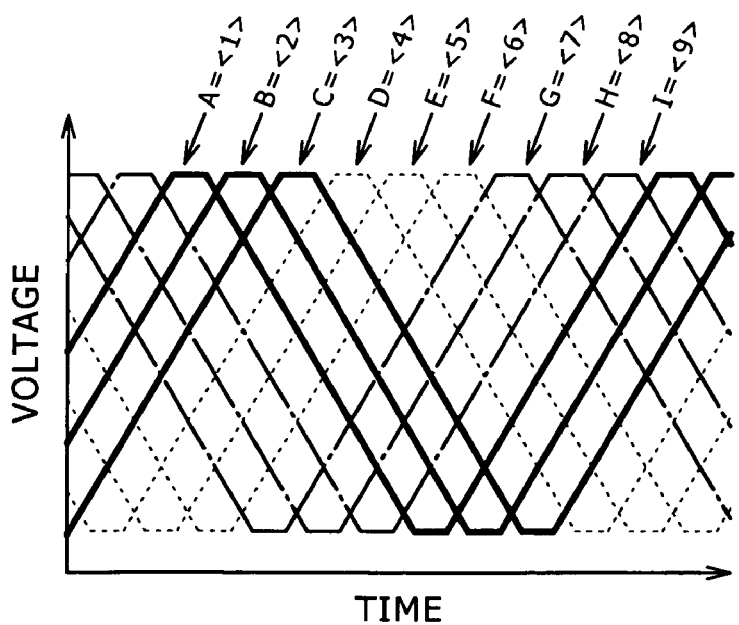

FIGS. 6A and 6B illustrate a phase transition in the nine-phase phase coupled ring type oscillation circuit where the phase rotation amount $\Phi a$ is $\Phi a=200°$. In particular, FIG. 6A shows a physical configuration and FIG. 6B illustrates an output oscillation waveform.

Figure 7A:
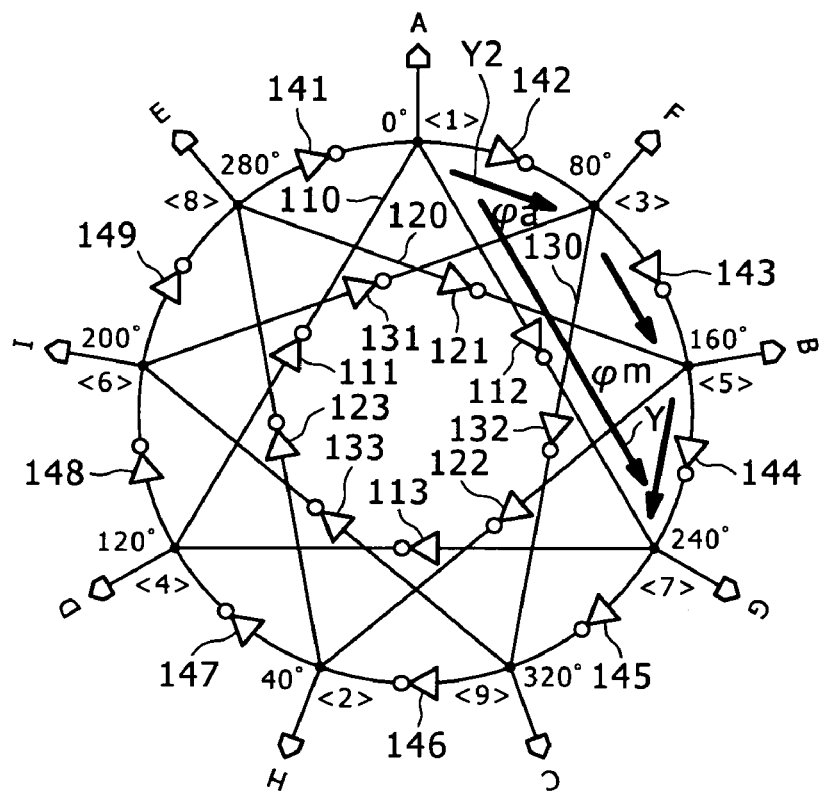
FIGS. 7A and 7B are diagrammatic views illustrating phase transition of $\Phi a=80°$ in the nine-phase phase coupled ring type oscillation circuit.
Figure 7B:
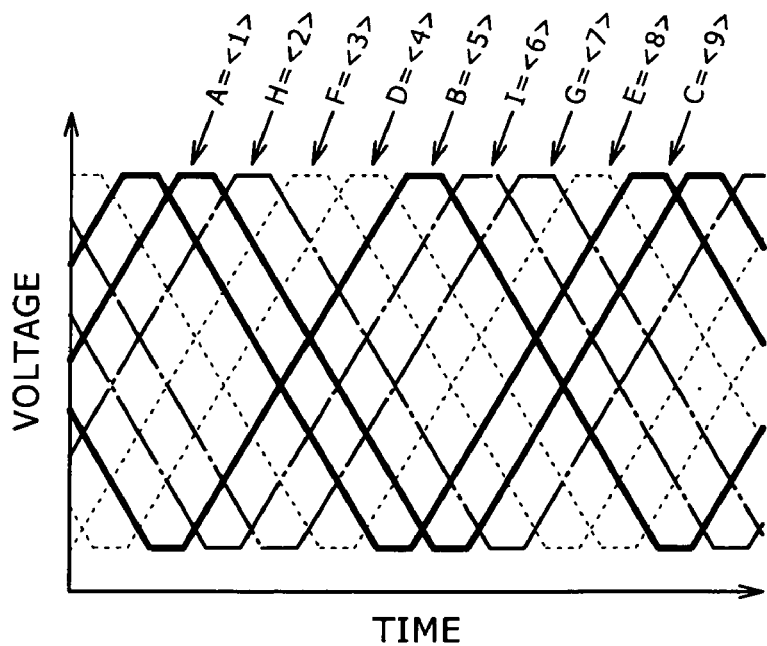

FIGS. 7A and 7B illustrate a phase transition in the nine-phase phase coupled ring type oscillation circuit where the phase rotation amount Φa is Φa=80°. In particular, FIG. 7A shows a physical configuration and FIG. 7B illustrates an output oscillation waveform.

Figure 8A:
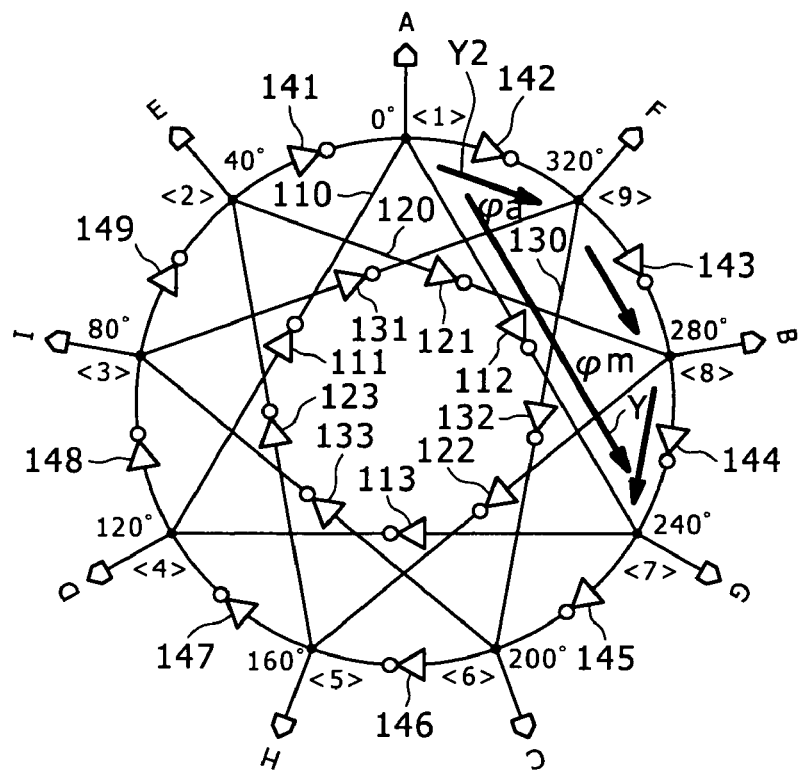
FIGS. 8A and 8B are diagrammatic views illustrating phase transition of $\Phi a=320°$ in the nine-phase phase coupled ring type oscillation circuit.
Figure 8B:
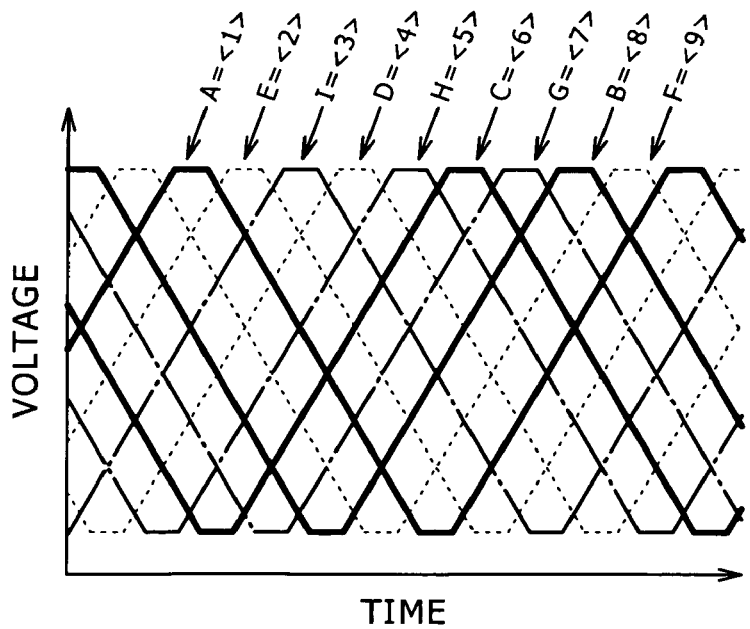

FIGS. 8A and 8B illustrate a phase transition in the nine-phase phase coupled ring type oscillation circuit where the phase rotation amount Φa is Φa=320°. In particular, FIG. 8A shows a physical configuration and FIG. 8B illustrates an output oscillation waveform.

Now, the phase rotation amount Φa=200° is regarded as a desired oscillation state and nodes A to I are set as seen in FIG. 6A.

This indicates that, if the output nodes A to I are arranged in order like A, B, C, . . . , then output phases are outputted in order like the first phase, second phase, third phase, . . . .

FIG. 6B illustrates oscillation waveforms outputted from the nodes of FIG. 6A.

Symbols described at an arrow mark indicating a waveform in FIG. 6B represent a node name in FIG. 6A and an order number when the phase is extracted. Such order numbers correspond to numerals (order numbers) indicated at the nodes of FIG. 6A.

For example, if the symbols are "A=<1>," then the waveform is that at the node A in FIG. 6A and the phase at the node is the first phase.

In particular, if the output nodes are arranged in order of A, B, C, . . . , also in FIG. 6B, then the phases are outputted in order like first, second, third, . . . .

On the other hand, FIGS. 7A and 7B illustrate a phase transition where the oscillation state becomes such that the phase rotation amount Φa=80° is exhibited although the output nodes are set so that the phase rotation amount Φa=200° provides a desired oscillation state.

An angle and a numeral shown at each node in FIG. 7A represent a phase outputted from the node and an order number, respectively, similarly as in FIG. 6A.

FIG. 7B schematically illustrates waveforms at the nodes so as to facilitate this. As can be seen from FIG. 7B, where the output nodes are arranged in order of A, B, C, . . . similarly as in the case wherein the phase rotation amount Φa is Φa=200°, the phases are outputted in order like first, fifth, ninth, . . . . In this manner, the order of the output phases is different.

Meanwhile, FIGS. 8A and 8B illustrate a phase transition where the oscillation state becomes such that the phase rotation amount Φa=320° is exhibited although the output nodes are set so that the phase rotation amount Φa=200° provides a desired oscillation state.

An angle and a numeral shown at each node in FIG. 8A represent a phase outputted from the node and an order number, respectively, similarly as in FIG. 6A.

FIG. 8B schematically illustrates waveforms at the nodes so as to facilitate this. As can be seen from FIG. 8B, where the output nodes are arranged in order of A, B, C, . . . similarly as in the case wherein the phase rotation amount Φa is Φa=200°, the phases are outputted in order like first, eighth, sixth, . . . . Also in this instance, the order of the output phases is different from that where the phase rotation amount Φa is Φa=200°.

As can be recognized from the example described above, if the output nodes are determined with reference to the phase rotation amount Φa=200°, then in the case of the phase rotation amount Φa=80° or Φa=320°, the output phase order becomes different from a desired output phase order.

While the foregoing relates to the case wherein the number of phases is 9, a write strategy system for an optical disk practically requires a multiphase clock having a phase number greater than 30.

For example, if a 33-phase phase coupled ring oscillation circuit is configured such that the number of stages of delay elements of one main ring is 3, that is, M=3, and the number of main rings connected in parallel is 11, that is, N=11, then the number of existing oscillation states is 11 from the foregoing description.

Further, while, in the example described hereinabove wherein the phase number is nine (M=3 and N=3), the difference ΔΦa of the phase rotation amount Φa which satisfies the expressions 1 to 3 is ΔΦa=120°, where the phase number is 33 (M=3 and N=11), the difference ΔΦa is as small as ΔΦa=32.7° and the oscillation state is likely to change.

Therefore, usually the number of delay element stages of a main ring is increased and the number of oscillation stages is decreased to increase the difference ΔΦa thereby to make it less likely for the oscillation state transition to occur.

However, if the configuration described is compared with another configuration which uses a main ring of a smaller number of delay element stages, then where the current consumption is equal, the oscillation frequency drops. Therefore, it cannot be avoided to increase the current consumption. In other words, usually a tradeoff relationship exists between the phase number and the current consumption from a point of view of the oscillation state, and besides, the range of selection of the phase number is narrowed by increase of the stage number of delay elements of a main ring.

In this manner, since an ordinary coupled type ring oscillation circuit has a plurality of oscillation states, where it is used for an application circuit or system, it naturally makes a cause of malfunction and besides has an inherent tradeoff in design, which restricts the flexibility in design.

Therefore, it is essentially required to eliminate the problems described above and achieve a technique or configuration for converging the oscillation state into a single desired oscillation state with certainty.

Therefore, the multiphase coupled ring type oscillation circuit 100 of the present first embodiment exhibits an example of a configuration for assuring a single oscillation state wherein the phase rotation amount Φa is Φa=200° by providing the configuration wherein the resistors R101 to R109 are connected across every two stages of inverters on the phase coupled ring 140.

In the following, the reason why the configuration shown in FIG. 3 oscillates in a single oscillation state wherein the phase rotation amount Φa is Φa=200°.

Figure 9A:
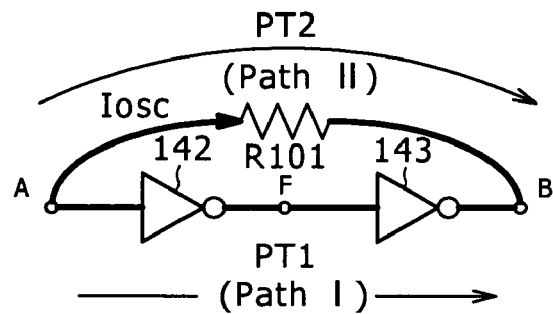
FIGS. 9A, 9B and 9C are diagrammatic views illustrating a converging mechanism to a single oscillation state in the multiphase coupled ring type oscillation circuit of FIG. 3.
Figure 9B:
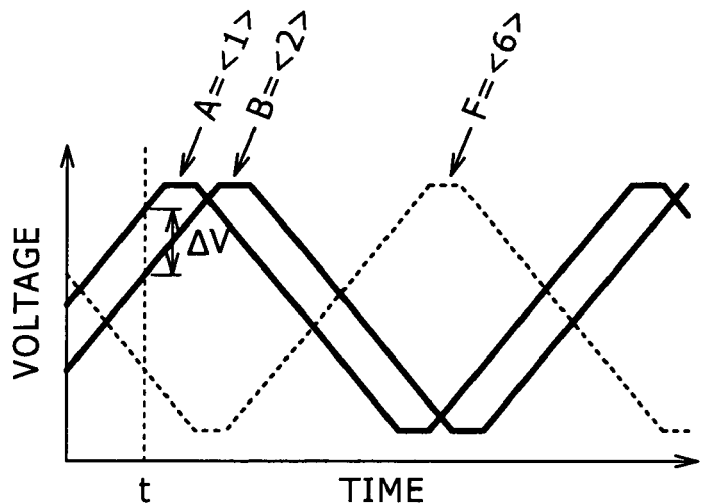
Figure 9C:
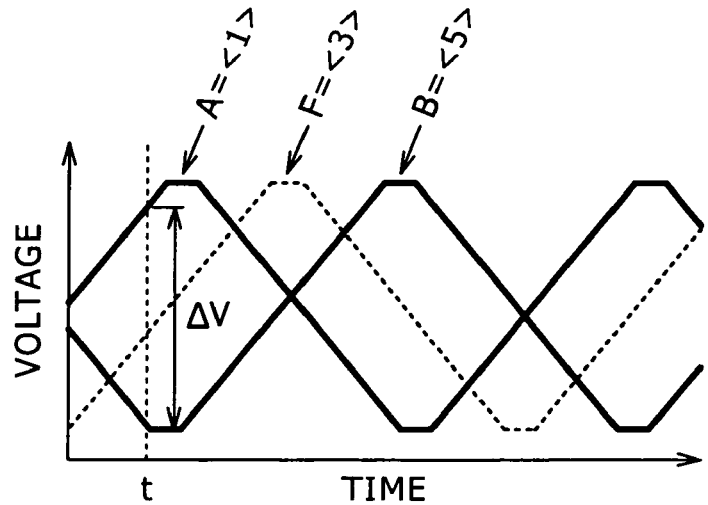

FIGS. 9A to 9C illustrate a convergence mechanism to a single oscillation state of the multiphase phase-coupled ring type oscillation circuit of the present first embodiment. Particularly, FIG. 9A shows part of an oscillator and FIG. 9B shows an example of an oscillation waveform where the phase rotation amount Φa is Φa=200° while FIG. 9C shows an example of an oscillation waveform where the phase rotation amount Φa is Φa=80°.

More particularly, FIG. 9A shows a portion of the multiphase phase-coupled ring type oscillation circuit from the node A to the node B shown in FIG. 3.

FIG. 9B illustrates voltage waveforms at the nodes A, B and F in FIG. 9A when the phase rotation amount Φa is Φa=200° as extracted from FIG. 6B.

If attention is paid to the oscillation waveforms at the nodes A and B where the phase rotation amount Φa is Φa=200°, then the potential difference between the two terminals at certain time t is ΔV. At this time, the resistor R101 connected between the nodes A and B supplies current Iosc corresponding to the potential difference ΔV to the node B.

FIG. 9C illustrates voltage waveforms at the nodes A, B and F in FIG. 9A when the phase rotation amount Φa is Φa=80° and is extracted from FIG. 7B.

As can be recognized from FIG. 9C, the potential difference ΔV between the nodes A and B at time t is greater than that when the phase rotation amount Φa is Φa=200°.

In particular, the potential difference across the resistor R101 connected between the nodes A and B increases, and the current Iosc at this time is higher than that where the phase rotation amount Φa is Φa=200°. This current Iosc flows into the node B which has a certain impedance and tends to raise the voltage at the node B.

In other words, the current Iosc flowing through the resistor R101 acts to decrease the potential difference ΔV, and force acts to correct the oscillation state from that where the phase rotation amount Φa is Φa=80° to that where the phase rotation amount Φa is Φa=200°.

This is convergence into a single oscillation state.

Also it is possible to interpret the foregoing description in the following manner. Where an inverter is considered from the point of view of a phase, it is an inverting element while a resistor is a non-inverting element.

Taking FIG. 9A as an example, in the first path PT1 shown, a signal at the node F after it passes an inverter of one stage has an inverted phase with respect to a signal inputted to the node A, and a signal at the node B after it passes two stage inverters is a non-inverted signal with respect to the phase at the node A.

On the other hand, in the second path PT2, a signal at the node B after the signal inputted to the node A passes the resistor R101 is a non-inverted signal.

Here, even if the first path PT1 has a non-ideal property, and even if the signal phase at the node B does not exhibit a non-inverted phase with respect to the signal at the node A, force tending to correct the signal phase at the node B to a non-inverted phase acts by an effect of the second path PT2.

Therefore, it is indicated that, by the connection of the first path PT1 and the second path PT2, an effect to make the signal at the node B a non-inverted signal with respect to that at the node A is intensified.

Figure 10A:
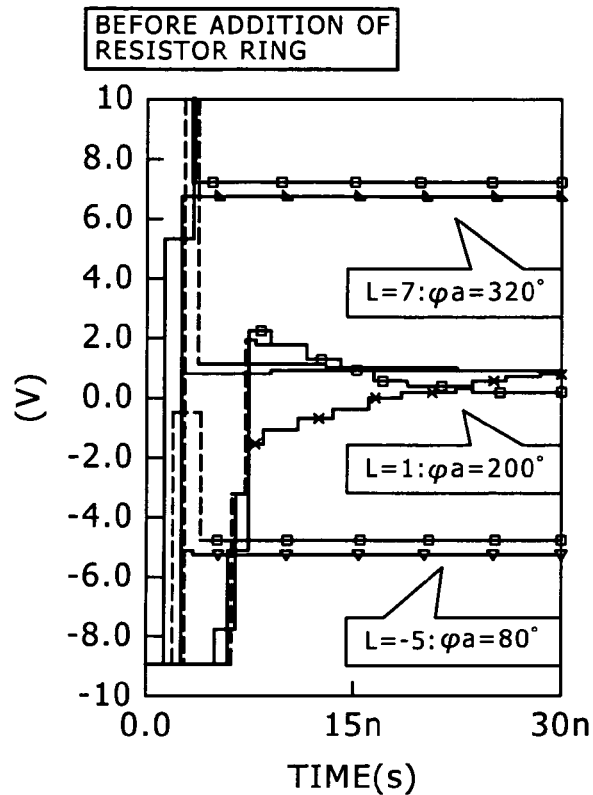
FIGS. 10A and 10B are graphs illustrating oscillation states of the multiphase coupled ring type oscillation circuit of FIG. 3 and the ordinary multiphase coupled ring type oscillation circuit shown in FIG. 5 for comparison.
Figure 10B:
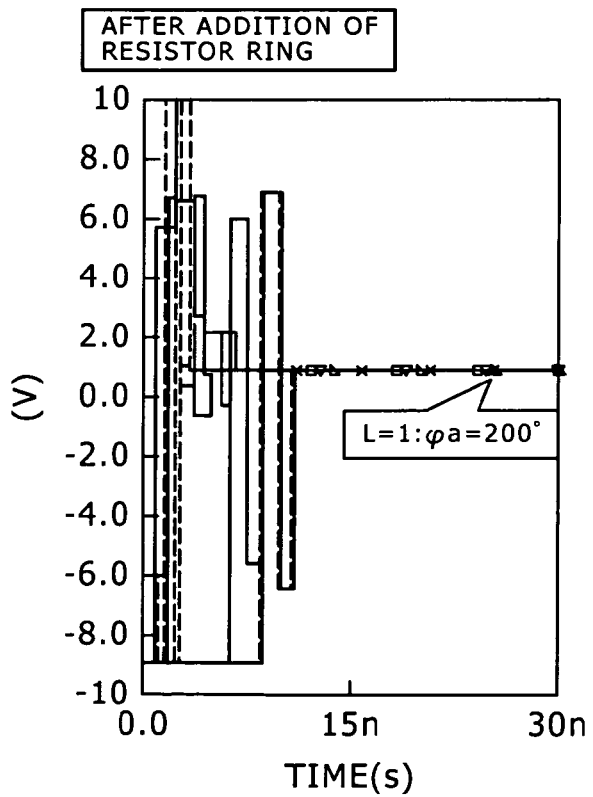

FIGS. 10A and 10B illustrate simulation results of an oscillation state when an initial potential is applied to the nodes of the multiphase phase-coupled ring type oscillation circuit shown in FIG. 3 and the multiphase phase-coupled ring type oscillation circuit shown in FIG. 5 and is then varied for comparison.

In particular, FIG. 10A illustrates a simulation result of the ordinary multiphase phase-coupled ring type oscillation circuit of FIG. 5 which does not include a resistor path.

Meanwhile, FIG. 10B illustrates a simulation result of the multiphase phase-coupled ring type oscillation circuit of FIG. 3 which includes a resistor path.

In FIGS. 10A and 10B, the axis of abscissa of graphs represents time and the axis of ordinate indicates the oscillation state, that is, L in the expression 2 given hereinabove.

From FIG. 10A, a manner can be seen in which the ordinary multiphase coupled ring type oscillation circuit 10A exhibits convergence into three oscillation states as time passes depending upon a difference of the initial state.

On the other hand, from FIG. 10B, a manner can be recognized in which the multiphase coupled ring type oscillation circuit 100 according to the present embodiment exhibits convergence into a single oscillation state as time passes regardless of a difference of the initial state. In other words, the multiphase coupled ring type oscillation circuit 100 according to the present embodiment can achieve the single oscillation state by a logical product of the phases of the resistor and the inverter.

2. Second Embodiment

Figure 11:
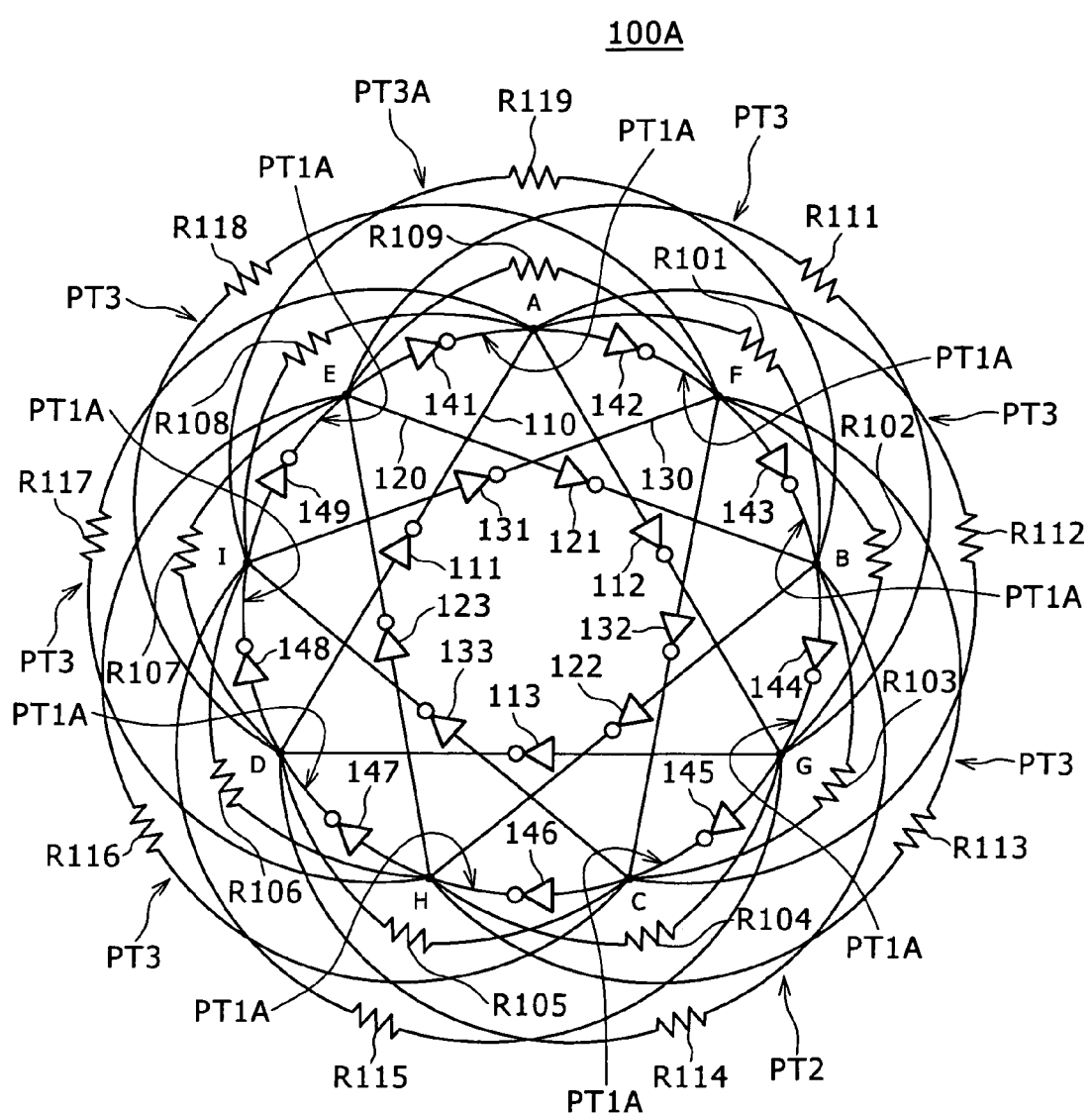
FIG. 11 is a diagrammatic view showing a configuration of a multiphase coupled ring type oscillation circuit according to a second embodiment of the present invention.

FIG. 11 shows a configuration of a multiphase phase-coupled ring type oscillation circuit according to a second embodiment of the present invention.

The subject matter of the present invention resides in that main rings are connected by a phase coupled ring formed from two or more paths having different properties with regard to the phase to establish a single oscillation state.

For example, while, in FIG. 3, a phase coupled ring is formed from two paths of inverters and resistors, the multiphase coupled ring type oscillation circuit 100A shown in FIG. 11 is configured such that a phase coupled ring is formed from three paths and particularly a resistor path PT3 is added to the configuration shown in FIG. 3.

The additional resistor path PT3 is formed from a stage of a resistor connected across every four stages of inverters of a phase coupled ring 140 and provides a correction effect similar to that described hereinabove.

More particularly, referring to FIG. 11, in the configuration shown, the node E or ND149 and the node G or ND144 are connected to each other by a resistor R111.

In particular, in the present embodiment, the node E or ND149 and the node G or ND144 are connected to each other by a resistor path PT3 having the resistor R111 different from a connection path of the four inverters 141 to 144 connected in series, that is, from a first path PT1A.

The node A or ND141 and the node C or ND145 are connected to each other by a resistor R112.

In particular, in the present embodiment, the node A or ND141 and the node C or ND145 are connected to each other by another resistor path PT3 having the resistor R112 different from a connection path of the four inverters 142 to 145 connected in series, that is, from another first path PT1A.

The node F or ND142 and the node H or ND146 are connected to each other by a resistor R113.

In particular, in the present embodiment, the node F or ND142 and the node H or ND146 are connected to each other by a further resistor path PT3 having the resistor R113 different from a connection path of the four inverters 143 to 146 connected in series, that is, from a further first path PT1A.

The node B or ND143 and the node D or ND147 are connected to each other by a resistor R114.

In particular, in the present embodiment, the node B or ND143 and the node D or ND147 are connected to each other by a still further resistor path PT3 having the resistor R114 different from a connection path of the four inverters 144 to 147 connected in series, that is, from a still further first path PT1A.

The node G or ND144 and the node I or ND148 are connected to each other by a resistor R115.

In particular, in the present embodiment, the node G or ND144 and the node I or ND148 are connected to each other by a yet further resistor path PT3 having the resistor R115 different from a connection path of the four inverters 145 to 148 connected in series, that is, from a yet further first path PT1A.

The node C or ND145 and the node E or ND149 are connected to each other by a resistor R116.

In particular, in the present embodiment, the node C or ND145 and the node E or ND149 are connected to each other by a yet further resistor path PT3 having the resistor R116 different from a connection path of the four inverters 146 to 149 connected in series, that is, from a yet further first path PT1A.

The node H or ND146 and the node A or ND141 are connected to each other by a resistor R117.

In particular, in the present embodiment, the node H or ND146 and the node A or ND141 are connected to each other by a yet further resistor path PT3 having the resistor R117 different from a connection path of the four inverters 147 to 149 and 141 connected in series, that is, from a yet further first path PT1A.

The node D or ND147 and the node F or ND142 are connected to each other by a resistor R118.

In particular, in the present embodiment, the node D or ND147 and the node F or ND142 are connected to each other by a yet further resistor path PT3 having the resistor R118 different from a connection path of the four inverters 148, 149, 141 and 142 connected in series, that is, from a yet further first path PT1A.

The node I or ND148 and the node B or ND143 are connected to each other by a resistor R119.

In particular, in the present embodiment, the node I or ND148 and the node B or ND143 are connected to each other by a yet further resistor path PT3 having the resistor R119 different from a connection path of the four inverters 149 and 141 to 143 connected in series, that is, from a yet further first path PT1A.

By employing such a multipath configuration as shown in FIG. 11, the phase coupled effect is further enhanced.

The oscillation circuit having the phase coupled ring described above includes a plurality of main rings 110, 120 and 130 each formed from a plurality of inverters as delay elements connected annularly, and a phase coupled ring 140 formed from a plurality of inverters 141 to 149 as first phase coupled elements connected annularly.

The plural main rings or ring oscillators include first connecting nodes ND111 to ND113, ND121 to ND123 and ND131 to ND133 between the inverters 111 to 113, 121 to 123 and 131 to 133 which are delay elements.

The phase coupled ring 140 includes second connecting nodes ND141 to ND149 between the inverters which are phase coupled elements.

The first connecting nodes ND111 to ND113, ND121 to ND123 and ND131 to ND133 of the main rings 110, 120 and 130 are connected to the different second connecting nodes ND141 to ND149 of the phase coupled ring 140.

In the phase coupled ring 140, arbitrary ones of the second connecting nodes are connected by at least the second path PT2 which is different from the first path PT1 in which the first phase coupled elements are disposed or further by the resistors R101 to R109 which are the second phase coupled elements disposed in the resistor path PT3.

In this manner, the multiphase coupled ring type oscillation circuits 100 and 100A according to the present embodiment can achieve convergence into a single desired oscillation state by connecting main rings using a phase coupled ring having a plurality of paths having different phase rotation amounts.

Further, since, also in multiphase oscillation, use of the proposed configuration described above makes convergence into a single oscillation state possible as described hereinabove, it is possible to use main rings having a small number of stages. In other words, enhancement in the degree of freedom in phase number selection and reduction of the current consumption can be anticipated.

Further, the oscillation circuit according to the present embodiment does not require a complicated controlling circuit and so forth and can be implemented by a simple configuration.

It is to be noted that an oscillation circuit having a phase coupled ring described hereinabove can basically adopt the following configuration.

In particular, the multiphase coupled ring type oscillation circuit 100 of the present embodiment includes n ring oscillators each of which forms a main ring and is formed by connecting m delay elements connected annularly. Here, m is an integer equal to or greater than 2 and also n is an integer equal to or greater than 2.

The phase coupled ring 140 is provided between an output of the delay element of the jth stage in the ith ring oscillator and an output of the delay element of the (i+a)th stage or, where (j+b)>m, of the (j+b−m)th stage. Here, i is an integer satisfying $1 \leq i \leq n$; j is an integer satisfying $1 \leq j \leq m$; and a is an integer.

Further, the phase coupled ring 140 is formed from k different types of phase coupled elements provided between an output of the delay element, where (i+a)>n, of the (j+b+1)th stage of the (i+a−n)th ring oscillator but, where (j+b+1)>m, of the (j+b+1−m)th stage.

Here, a is an integer and is a residue when k is divided by n. k is an integer and satisfies $1 \leq k \leq m \cdot n/2$. Further, b is an integer and a quotient when k is divided by n.

Further, where an action of causing the phase to be inverted is applied between two nodes between which an element of the kth type from among the k different types of phase coupled elements where k is an even number is connected, another action of causing the phase not to be inverted is applied between two nodes between which an element of the kth type where k is an odd number is connected.

Or, where an action of causing the phase to be inverted is applied between two nodes between which an element of the kth type from among the k different types of phase coupled elements where k is an odd number is connected, another action of causing the phase not to be inverted is applied between two nodes between which an element of the kth type where k is an even number is connected.

The phase coupled ring 140 includes at least two types of phase coupled elements from among the k different types of phase coupled elements.

In the present embodiment, the used types of phase coupled elements are an inverter and a resistor.

With the oscillation circuit 100 of the present embodiment, since it has the configuration described above, the following advantages can be anticipated.

In particular, oscillation in a single oscillation state can be implemented by a simple circuit configuration.

Moderation of the design tradeoff and enhancement of the degree of freedom in phase number selection can be anticipated and reduction in current consumption can be achieved.

The oscillation circuit 100 of the present embodiment can be incorporated by a less expensive standard CMOS process without the necessity for a special element.

Further, there is no necessity for a complicated control circuit and so forth and system design is easy.

The multiphase coupled ring type oscillation circuits 100 and 100A having the phase coupled ring described above can be applied, for example, to a write strategy section for producing a multiphase write clock for an optical disk apparatus as a recording and reproduction apparatus.

3. Third Embodiment

Figure 12:
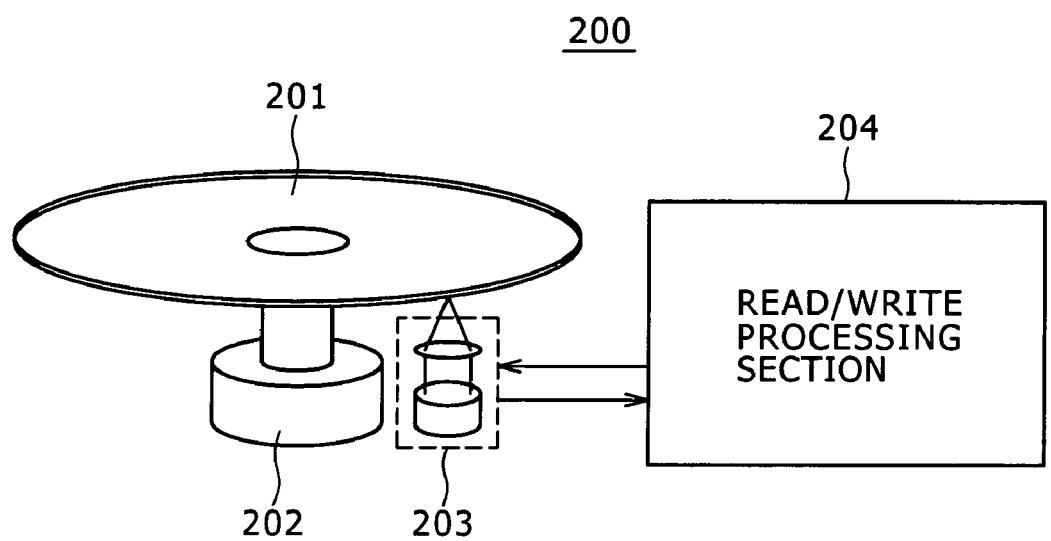
FIG. 12 is a schematic view conceptionally showing an optical disk apparatus having a write strategy section.

FIG. 12 conceptionally shows an optical disk apparatus having a write strategy section.

Referring to FIG. 12, the optical disk apparatus 200 shown includes an optical disk 201 as a recording medium, a spindle motor 202, an optical pickup 203 as an optical recording and reproduction section, and a read/write processing section 204.

It is to be noted that, in FIG. 12, circuits for a servo system and a control system are omitted for simplified illustration.

The read/write processing section 204 includes a DSP (Digital Signal Processor) and so forth and has a recording system circuit and a reading system.

Figure 13:
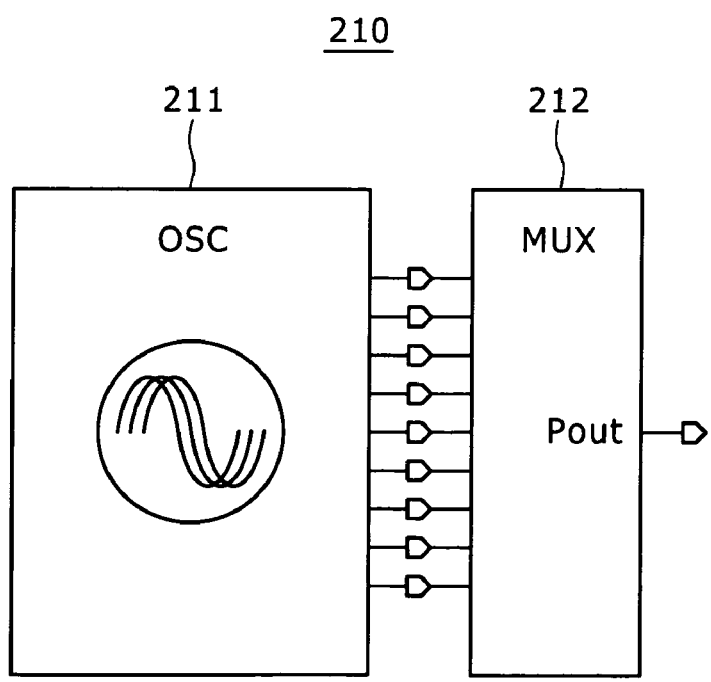
FIG. 13 is a diagrammatic view showing a general configuration of the write strategy section shown in FIG. 12.

The recording system circuit has such a write strategy section 210 for supplying a multiphase write clock to the optical pickup 203 through a driver not shown as seen in FIG. 13.

The write strategy section 210 includes an oscillation circuit (100 or 100A) according to an embodiment of the present invention or a multiphase oscillation circuit (OSC) 211 and a multiplexer (MUX) 212 for selecting a write clock of a suitable phase.

Since the optical disk apparatus 200 adopts a multiphase phase-coupled ring type oscillation circuit according to an embodiment of the present invention, the phase order does not change and the oscillation state can be converged to a single desired oscillation state. Consequently, appearance of a write error can be suppressed.

The present application contains subject matter related to that disclosed in Japanese Priority Patent Application JP 2009-161796 filed in the Japan Patent Office on Jul. 8, 2009, the entire content of which is hereby incorporated by reference.

While preferred embodiments of the present invention have been described using specific terms, such description is for illustrative purpose only, and it is to be understood that changes and variations may be made without departing from the spirit or scope of the following claims.

What is claimed is:

1. An oscillation circuit, comprising:
n ring oscillators each formed from m delay elements connected annularly, m being an integer equal to or greater than 2, n being an integer equal to or greater than 2; and
a phase coupled ring comprising:
k phases;
a first set of k phase coupled elements connected annularly by k nodes; and
a second set of k phase coupled elements connecting two nodes which are separated by another node,
k being an integer that satisfies k=m×n.

2. The oscillation circuit according to claim 1, wherein the first set of k phase coupled elements includes a first type of phase coupled elements and the second set of k phase coupled elements includes a second type of phase coupled elements that is different from the first type of phase coupled elements.

3. The oscillation circuit according to claim 2, wherein the first type of phase coupled elements includes inverters and the second type of phase coupled elements includes resistors.

4. An oscillation circuit, comprising:
a plurality of ring oscillators each formed from a plurality of delay elements connected annularly; and
a phase coupled ring formed from a plurality of first phase coupled elements connected annularly;
each of said ring oscillators including a plurality of first connecting nodes between said delay elements;
said phase coupled ring including a plurality of second connecting nodes between two of the plurality of first phase coupled elements;
said first connecting nodes of said ring oscillators being individually connected to said second connecting nodes different from each other of said phase coupled ring; and
each of second phase coupled elements connecting one of the plurality of second connecting nodes and another of the plurality of second connecting nodes, which are separated by two phase coupled elements.

5. The oscillation circuit according to claim 4, wherein the plurality of first phase coupled elements have a phase inverting function while said second phase coupled elements do not have the phase inverting function.

6. The oscillation circuit according to claim 4, wherein each of the plurality of first phase coupled elements is an inverter and each of said second phase coupled elements is a resistor.

7. A recording apparatus, comprising:
a recording medium;
an optical recording section configured to write information into or on said recording medium in response to a multiphase write clock; and
a write strategy section configured to supply the multiphase write clock to said optical recording section;
said write strategy section including an oscillation circuit for oscillating the multiphase write clock and a multiplexer for selecting a write clock of a phase from within an output of said oscillation circuit and supplying the selected write clock to said optical recording section;
said oscillation circuit including n ring oscillators each formed from m delay elements connected annularly, m being an integer equal to or greater than 2, n being an integer equal to or greater than 2, and a phase coupled ring comprising:
k phases;
a first set of k phase coupled elements connected annularly by k nodes; and
a second set of k phase coupled elements connecting two nodes which are separated by another node,
k being an integer that satisfies k=m×n.

8. The oscillation circuit according to claim 7, wherein the first set of k phase coupled elements includes a first type of phase coupled elements and the second set of k phase coupled elements includes a second type of phase coupled elements that is different from the first type of phase coupled elements.

9. The oscillation circuit according to claim 8, wherein the first type of phase coupled elements includes inverters and the second type of phase coupled elements includes resistors.

10. A recording apparatus, comprising:
a recording medium;
an optical recording section configured to write information into or on said recording medium in response to a multiphase write clock; and
a write strategy section configured to supply the multiphase write clock to said optical recording section;
said write strategy section including an oscillation circuit for oscillating the multiphase write clock and a multiplexer for selecting a write clock of a phase from within an output of said oscillation circuit and supplying the selected write clock to said optical recording section;
said oscillation circuit including a plurality of ring oscillators each formed from a plurality of delay elements connected annularly, and a phase coupled ring formed from a plurality of first phase coupled elements connected annularly;
each of said ring oscillators including a plurality of first connecting nodes between said delay elements;

said phase coupled ring including a plurality of second connecting nodes between two of the plurality of first phase coupled elements;

said first connecting nodes of said ring oscillators being individually connected to said second connecting nodes different from each other of said phase coupled ring; and each of second phase coupled elements connecting one of the plurality of second connecting nodes and another of the plurality of second connecting nodes, which are separated by two phase coupled elements.

11. The oscillation circuit according to claim 10, wherein the plurality of first phase coupled elements have a phase inverting function while said second phase coupled elements do not have the phase inverting function.

12. The oscillation circuit according to claim 10, wherein each of the plurality of first phase coupled elements is an inverter and each of said second phase coupled elements is a resistor.

* * * * *